(12) United States Patent
Edelstein

(10) Patent No.: US 9,030,780 B2
(45) Date of Patent: May 12, 2015

(54) METHOD AND APPARATUS FOR READING A NON-VOLATILE MEMORY USING A SPIN TORQUE OSCILLATOR

(71) Applicant: U.S. Army Research Laboratory, Adelphi, MD (US)

(72) Inventor: Alan S. Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/717,745

(22) Filed: Dec. 18, 2012

(65) Prior Publication Data

US 2014/0043709 A1   Feb. 13, 2014

Related U.S. Application Data

(60) Provisional application No. 61/680,834, filed on Aug. 8, 2012.

(51) Int. Cl.

| | |
|---|---|
| *G11B 5/33* | (2006.01) |
| *G11B 5/09* | (2006.01) |
| *G11C 11/16* | (2006.01) |
| *G11B 11/14* | (2006.01) |

(52) U.S. Cl.
CPC .. *G11B 5/09* (2013.01); *G11B 5/33* (2013.01); *G11C 11/16* (2013.01); *G11B 5/332* (2013.01); *G11B 11/14* (2013.01)

(58) Field of Classification Search
CPC ........ G11B 5/02; G11B 5/147; G11B 5/1278; G11B 5/23; G11B 5/3146; G11B 5/3903; G11B 20/10018; G11B 20/10027; G11B 20/06; G11B 33/00; G11B 33/093; G11B 33/1284; G11B 5/33; G11B 5/332; G11B 11/14

USPC ............. 360/39, 46, 55, 67, 68, 75, 313, 324, 360/324.1, 324.11, 324.12, 324.2
See application file for complete search history.

(56) References Cited

U.S. PATENT DOCUMENTS

| | | | |
|---|---|---|---|
| 4,021,728 | A * | 5/1977 | Makino et al. ................ 361/180 |
| 5,204,192 | A | 4/1993 | Nakamura et al. |
| 5,764,567 | A | 6/1998 | Parkin |
| 6,072,382 | A | 6/2000 | Daughton et al. |
| 6,330,136 | B1 | 12/2001 | Wang et al. |
| 6,331,364 | B1 | 12/2001 | Baglin et al. |
| 6,349,053 | B1 | 2/2002 | Daughton et al. |
| 6,381,171 | B1 | 4/2002 | Inomata et al. |
| 6,383,597 | B1 | 5/2002 | Fullerton et al. |

(Continued)

OTHER PUBLICATIONS

B.D. Cullity and C.D. Graham. "Introduction to Magnetic Materials," 2nd edition.pp. 383-394 2009.

(Continued)

*Primary Examiner* — Thomas Alunkal
(74) *Attorney, Agent, or Firm* — Lawrence E. Anderson

(57) ABSTRACT

A method and apparatus for reading electronic memory comprising a current source, a spin transfer oscillator, an external field source, coupled to the current source, for generating an RF signal, the spin torque oscillator positioned proximate a magnetic media comprising a plurality of bit regions of varying magnetic permeability, wherein a frequency of the RF signal varies in response to the permeability of a bit region in the plurality of bit regions being proximate the spin torque oscillator.

5 Claims, 4 Drawing Sheets

(56) References Cited

U.S. PATENT DOCUMENTS

| | | | |
|---|---|---|---|
| 6,383,598 B1 | 5/2002 | Fullerton et al. | |
| 6,418,048 B1 | 7/2002 | Sin et al. | |
| 6,462,641 B1 | 10/2002 | Dieny et al. | |
| 6,762,954 B1 | 7/2004 | Edelstein | |
| 6,947,319 B1 | 9/2005 | Edelstein | |
| 7,233,142 B1 | 6/2007 | Edelstein | |
| 7,791,829 B2* | 9/2010 | Takeo et al. | 360/55 |
| 8,325,442 B2 | 12/2012 | Koui | |
| 8,755,153 B2* | 6/2014 | Kudo et al. | 360/321 |
| 2002/0008948 A1 | 1/2002 | Sasaki et al. | |
| 2002/0047145 A1 | 4/2002 | Nickel | |
| 2002/0068195 A1 | 6/2002 | Lundstrom | |
| 2008/0102320 A1 | 5/2008 | Edelstein et al. | |
| 2009/0201614 A1* | 8/2009 | Kudo et al. | 360/324.11 |
| 2010/0053795 A1 | 3/2010 | Kudo et al. | |
| 2010/0079919 A1* | 4/2010 | Nagasawa et al. | 360/324.1 |
| 2011/0007431 A1* | 1/2011 | Braganca et al. | 360/324.12 |
| 2011/0038081 A1* | 2/2011 | Contreras et al. | 360/125.03 |
| 2011/0149428 A1* | 6/2011 | Franca-Neto et al. | 360/75 |
| 2011/0205667 A1* | 8/2011 | Yamada et al. | 360/122 |
| 2012/0154952 A1* | 6/2012 | Yamada et al. | 360/125.12 |
| 2012/0307404 A1* | 12/2012 | Braganca et al. | 360/245.8 |
| 2013/0070367 A1* | 3/2013 | Igarashi et al. | 360/75 |

OTHER PUBLICATIONS

Zhimin,Y., et al., "Perspectives of Magnetic Recording System at 10 Tb/in" Magnetic Recording Conference, 2009. APMRC '09. Asia-Pacific. 2009.

Evans, R.F.L., et al., "Thermally induced error: Density limit for magnetic data storage," Applied Physics Letters, 2012. 100(10): p. 102402-3.

Thompson, D.A., et al., "The Future of Magnetic Data Storage Technology," IBM Journal of Research and Development, 2000. 44(3): p. 311-322.

C. Kim, "Future Memory Technology Trends and Challenges," in Proceedings of the 7th International Symposium on Quality Electronic Design 2006, IEEE Computer Society. p. 513.

H. Sungjoo, "Memory Technology Trend and Future Challenges," Electron Devices Meeting (IEDM), 2010 IEEE International. 2010.

Makarov, A., et al. "Emerging memory technologies: Trends, challenges, and modeling methods," Microelectronics Reliability, 2012. 52(4): p. 628-634.

R.P. Cowburn, "The Future of Universal Memory" Materials Today, 2003. 6(7-8): p. 32-38.

Kryder , M. H., et al., "After Hard Drives—What Comes Next?," IEEE Transactions on, 45(10): p. 3406-3413 (2009).

H.J. Richter, "The Transition from Longitudinal to Perpendicular Recording," Journal of Physics D: Applied Physics, 2007. 40(9): p. R149.

Krush, K. "Sputter Parameters and Magnetic Properties of Permallory for Thin Film Heads," IEEE Transactions on Magnetics, vol. MAG-22, No. 5, p. 626 Sep. 1986.

R. Skomski and D.J. Sellmyer, "Intrinsic and Extrinsic Properties of Advanced Magnetic Materials," Handbook of Advanced Magnetic Materials, Y. Liu, D. Sellmyer, and D. Shindo, Editors. 2006, Springer US. p. 1-57.

Liou, S.H., et al., "Picotesla Magnetic Sensors for Low-Frequency Applications," Magnetics, IEEE Transactions on, 2011. 47(10): p. 3740-3743.

Ikeda,S., et al., "Magnetic Tunnel Junctions for Spintronic Memories and Beyond," Electron Devices, IEEE Transactions on, 2007. 54(5): p. 991-1002.

Edelstein, Alan, et al., "Phase-separated Fe and Co Particles in a BN Matrix," J. Appl. Phys., Apr. 15, 1987, pp. 3320-3322, vol. 61, No. 8, Ser. 2A.

Ohring, Milton, "The Materials Science of Thin Films," Academic Press, p. 224 (1992).

\* cited by examiner

METHOD AND APPARATUS FOR READING A NON-VOLATILE MEMORY USING A SPIN TORQUE OSCILLATOR

CROSS REFERENCE TO RELATED APPLICATIONS

This application claims benefit of U.S. provisional patent application Ser. No. 61/680,834 filed Aug. 8, 2012 which is herein incorporated by reference.

GOVERNMENT INTEREST

Government Interest—The invention described herein may be manufactured, used, and licensed by or for the U.S. Government without the payment of royalties thereon.

FIELD OF INVENTION

Embodiments of the present invention generally relate to memory devices and, more specifically to a method and apparatus for reading non-volatile magnetic memory.

BACKGROUND OF THE INVENTION

Most modern memory is based on the evolution of magnetic recording. One form of magnetic memory is a hard disk wherein magnetic bits of information are stored on a magnetic film medium in very small localized regions. Depending on the magnetization within a region, each region represents either a logic high or logic low value (i.e. a "1" or "0"). The regions are electronically read via moving mechanical read/write heads. The heads are mounted proximate a spinning disk supporting a magnetic film. A read head operates by sensing changes in the resistance of the sensor in the read head induced by the data bit regions as they pass under the read head. A write head stores data on the disk by utilizing magnetic flux to set the direction and amplitude of the magnetic moment for each bit region passing beneath the write head.

Disk storage has a limited storage lifetime, bit density, and volatility. The magnetic medium used in traditional disk storage degrades within 10 years. The information is stored in small magnetic bit regions through magnetizing each region in a particular direction. Over time, the magnetization of the bit regions is corrupted by external electromagnetic forces, through prolonged exposure to the Earth's magnetic field, or through thermal upsets. Thermal upsets are statistical processes that occur when the magnetization of a bit region is thermally activated to overcome the anisotropy barrier.

Bit density of conventional hard disks is near 200 Gbits/$in^2$; however, bit region size is limited by the superparamagnetic limit. Traditional magnetic recording is approaching the superparamagnetic limit. Thus, further advances in storage density using traditional storage techniques is becoming increasingly difficult.

As electronic recording evolves and more information is digitized, there exists not just a critical necessity for storage volume but also storage permanency. Therefore, a need exists for high density, stable, non-volatile memory with a longer storage lifetime.

BRIEF SUMMARY OF THE INVENTION

A method and apparatus for reading electronic memory comprising a current source, a spin transfer oscillator, coupled to the current source, for generating a radio frequency (RF) signal, a magnetic probe field, a magnetic media comprising bit regions of varying magnetic permeability, the spin torque oscillator positioned proximate the magnetic media, wherein a frequency of the RF signal varies in response to the change of the magnetic probe field and/or a self field of the spin transfer oscillator caused by the permeability of the bit region proximate the spin torque oscillator are provided herein. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
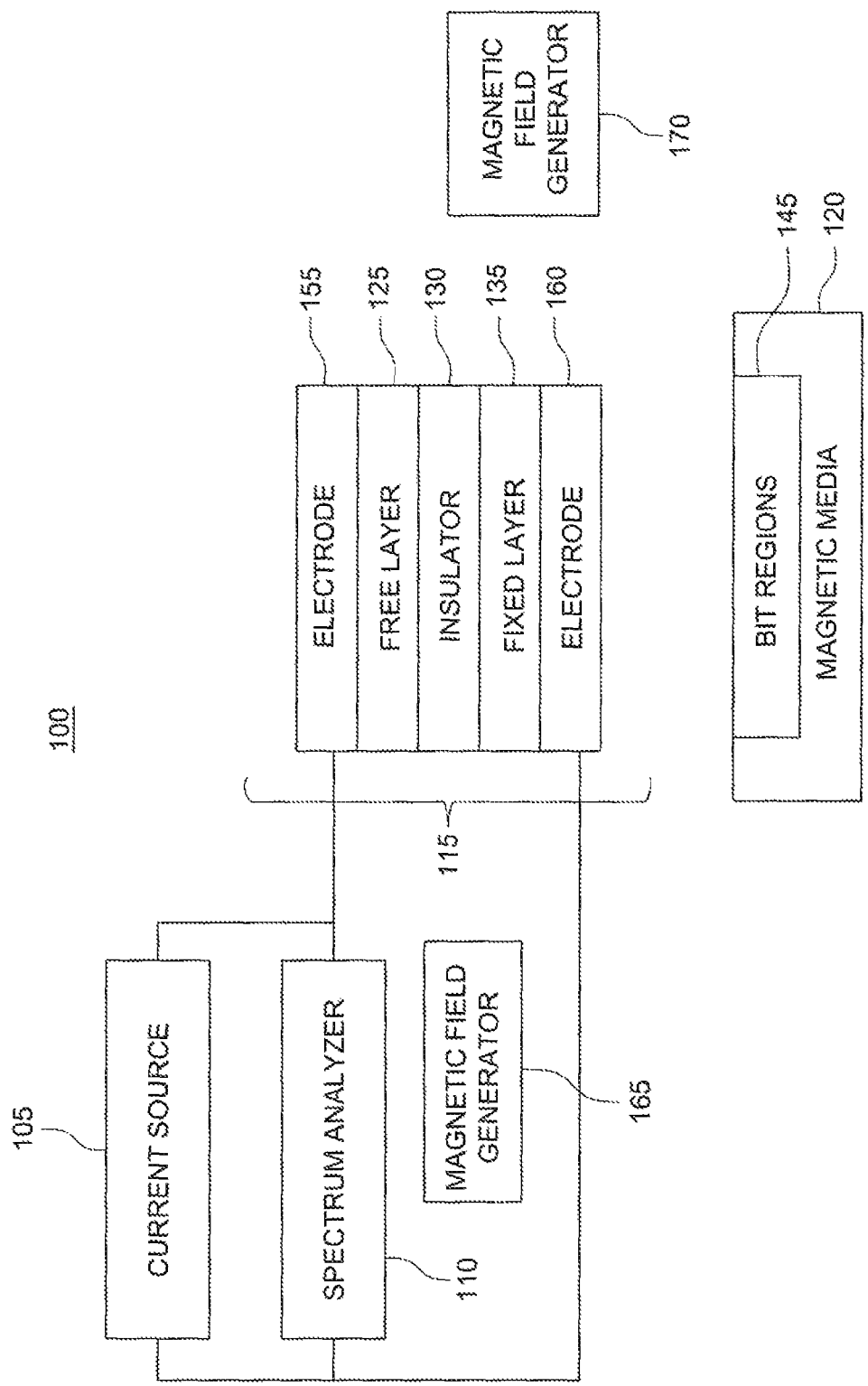
FIG. 1 is an illustration of an exemplary embodiment of the present invention using a spin torque oscillator (STO) and a spectrum analyzer to read magnetic media.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION OF THE INVENTION

Embodiments of the present invention relate to reading magnetic memory comprising regions of high and low magnetic permeability using a spin torque oscillator (STO). The STO can have various forms that include magnetic tunnel junctions and spin valves. One embodiment, includes a current source driving an STO to produce an RF signal. The STO is positioned proximate a magnetic media and a spectrum analyzer measures a frequency of an RF signal that varies in response to the permeability of bit regions on the magnetic media.

FIG. 1 is an illustration of an exemplary embodiment of the present invention using a spin torque oscillator, a spectrum analyzer to read magnetic media, and in some embodiments a magnetic field source. In one embodiment, a reader 100 comprises a constant current source 105, a spectrum analyzer 110, spin torque oscillator (STO) 115, and magnetic media 120. The constant current source 105, spectrum analyzer 110, and STO 115 are electrically connected in parallel. The STO 115 is positioned to hover proximate the magnetic media 120.

The media 120 is comprised of individually aligned bit regions 145 and of material capable of being written and kept in a stable, non-volatile state while still maintaining their magnetic permeability such as Permalloy or Metglas. Metglas for example may be written with a laser such that cooling rates determine whether a bit region has a high permeability (amorphous state) or low permeability (crystalline state). The cooling rate of a laser that gradually turns off is vastly different to a laser that instantly turns off. The cooling rates produce two distinct permeability regions on the Metglas that represent 1's and 0's. The resultant bit data may be permanent so long as the Metglas is not exposed to high heat (i.e. in excess of 500° C.). The bit regions 145 may be radially aligned on a disk or arranged as a grid for accurately locating and reading the individual regions 145 of the media 120.

In the embodiment of FIG. 1, the STO 115 has a magnetic tunnel junction. The STO 115 (also known as a spin transfer oscillator or spin transfer torque microwave oscillator) is comprised of a top electrode 155, a magnetic free layer 125, a non-magnetic layer insulator 130, a magnetic fixed (i.e. pinned) layer 135, and a lower electrode 160. A current is passed from the current source 105 through the STO electrodes (155 and 160) such that spin polarized current passes through the insulator 130. The magnetic moment of the free layer 125 is parallel to the non-magnetic layer 130 which in some embodiments may be comprised of an insulating non-magnetic material such as Magnesium Oxide (MgO) or Aluminum Oxide ($Al_2O_3$). The combination of the fixed layer 135, insulator 130, and free layer 125 forms what is known as a magnetic tunnel junction. In the magnetic tunnel junction, the non-magnetic insulating layer 130 acts as a spacer to magnetically decouple the free layer 125 and the fixed layer 135. If the nonmagnetic layer 130 is instead a conductor, the STO is a spin valve. In either case the free layer 125 of the STO 115 can rotate in response to external magnetic fields (discussed further below) and/or spin polarized currents In the STO 115, a spin polarized current driven through the fixed layer 135 tends to cause the magnetization to align parallel to the magnetization of the fixed layer 135. This tendency, results from the angular momentum of the electrons in the current giving rise to torque that acts on the magnetization of the free layer. This torque prevents the magnetization of the free layer 125 from aligning in the direction of the magnetic field. Instead the magnetization of the free layer precesses around the magnetic field and the system emits microwave radiation at the Larmor frequency that is set by the magnetic field strength. If current is driven from the free layer 125 to the fixed layer 135, the tunneling electrons align with the free layer 125 then impact and reflect off the fixed layer 135. These electrons then interact with the free layer 125 and tend to align the free layer anti-parallel to the fixed layer 135. Again, the torque transfer causes microwave oscillation. In either case, the magnetization of the free layer 125 precesses and the STO radiates microwave energy at a Larmor frequency that is proportional to the vector cross product $\vec{M} \times \vec{H}_{eff}$ where $\vec{M}$ is the magnetization of the free layer and $\vec{H}_{eff}$ is the effective field acting on the magnetization of the free layer.

The current density driving the STO 115 must be very high (e.g. $10^7$ amps/cm$^2$) and be spin polarized. The motion of the free layer 125 is governed by a modification of Landau-Lifshitze-Gilbert (LLG) equation:

$$\frac{\partial \vec{M}}{\partial t} = -\gamma \vec{M} \times \vec{H}_{eff} + \alpha \vec{M} \times \frac{\partial \vec{M}}{\partial t} - b_j \vec{M} \times \left( \vec{M} \times \frac{\partial \vec{M}}{\partial x} \right) \quad (1)$$

In equation (1), $\vec{M}$ is the magnetic moment of the free layer, $\vec{H}_{eff}$ is the effective magnetic field (whether from the fixed layer or from an external source such as the probe field or the magnetic media) and includes the anisotropy field, magnetostatic field, and exchange field. Variable $\gamma$ is the gyromagnetic ratio, x is the direction of the current flux and $\alpha$ is a constant which determines the relaxation rate. The quantity $b_j$ is given by:

$$b_j = P j_e \mu_B / e M_s \quad (2)$$

In equation (2), P is the spin polarization of the current, $\mu_B$ is the Bohr magnetization, $j_e$ is the electric current density, e is the electronic charge, and $M_s$ is the saturation magnetization of the magnetization $\vec{M}$.

The first term on the right hand side of the equation (1) (i.e. $-\gamma \vec{M} \times \vec{H}_{eff}$) gives rise to the precession and the second term $$\left( \text{i.e.: } \alpha \vec{M} x \frac{\partial \vec{M}}{\partial t} \right)$$

is responsible for the relaxation of the magnetization. The third term $$\left( \text{i.e.: } -b_j \vec{M} x \left( \vec{M} x \frac{\partial \vec{M}}{\partial x} \right) \right)$$

provides a torque that opposes the relaxation and keeps the magnetization of the free layer precessing at some fixed angle relative to the effective field $\vec{H}_{eff}$. Note the dependence on the spin polarized current in the third term of equation (2). The frequency of the microwave radiation is proportional to the magnitude of the magnetic field $\vec{H}_{eff}$. As will be discussed further below, the magnetic field can either be from the other layers of the magnetic tunnel junction or from an external field generator (165 and 170) or combination thereof.

The permeability of the media modifies the effective magnetic field $\vec{H}_{eff}$ in equation (1) in that it attracts magnetic field lines into the regions of the media with high permeability. In general the media affects both the magnitude and direction of $\vec{H}_{eff}$. Depending on the geometry, i.e., the position of the high permeability regions in the media, the media can either increase or decrease the field at the position of the STO. The change in $\vec{H}_{eff}$ depends on the amount of permeability for a specific bit area/region of a plurality of bit regions 145 on the media 120. Because of the first term in Eq. 1, the change in $\vec{H}_{eff}$ changes the precession frequency and thus the frequency of the microwave radiation emitted by the STO. Since the STO 115 has a high quality factor (Q), small changes in the microwave radiation are easily detectable.

The voltage across the STO may be directly measured with the spectrum analyzer 110 such that the changes in the precession frequency may be directly detected. Otherwise, changes may be indirectly detected through measurement of the amplitude and the shift width of the resonance frequency. Other embodiments may include an antenna to indirectly capture and couple the signal to the spectrum analyzer 110.

The magnetic permeable media 120 will modify the RF signal from the STO 115 in two ways. Firstly, the permeability will modify the magnetic field at the position of the STO 115 by drawing in magnetic flux. Modifying the field will shift the RF precession frequency. Secondly, the media 120 will absorb microwave energy because of resistive losses. Since energy is absorbed, this will decrease the amplitude of the oscillation and lower the Q.

As the reader 100 operates based on the magnetic permeability of the media 120, the memory is non-volatile as permeability is an intrinsic property. Lifetime integrity is also extended almost indefinitely as the media 120 no longer needs to hold a minimum energy for maintaining the magnetization direction that determines the bit value of the individual bit regions. Furthermore, since the reader 100 is not reliant on the magnetization direction of the regions, the media 120 is not limited by the superparamagnetic limit and may have greater bit volume. Thus in some exemplary embodiments, the reader 100 may read bits that are 20×20 nm or 400 nm with a bit density of $2 \times 10^{13}/cm^2$. The bit values detected by the spectrum analyzer may then be output to a computer for additional processing of the information.

In the above embodiment, the magnetic field generators (165 and 170) may be permanent magnets, electromagnets and/or the like. In some instances, the reader 100 may use the magnetic field generators (165 and 170) to generate a probe magnetic field when the STO 115 does not emit the correct RF frequency. The addition of the magnetic field generators (165 and 170) allows for improved freedom to tailor the STO 115 for particular media 120 by modifying the frequency of the microwave radiation from the STO 115. Alternatively, one can control the proximate magnetic field generators (165 and 170) to optimize performance with a given STO. A large frequency shift arising from applying the magnetic field generators (165 and 170) allows the STO 115 to operate within a larger frequency band. The frequency modification thus may effectively change the RF frequency of the STO to accommodate for the sensitivity of instruments such as the spectrum analyzer 110.

Figure 2:
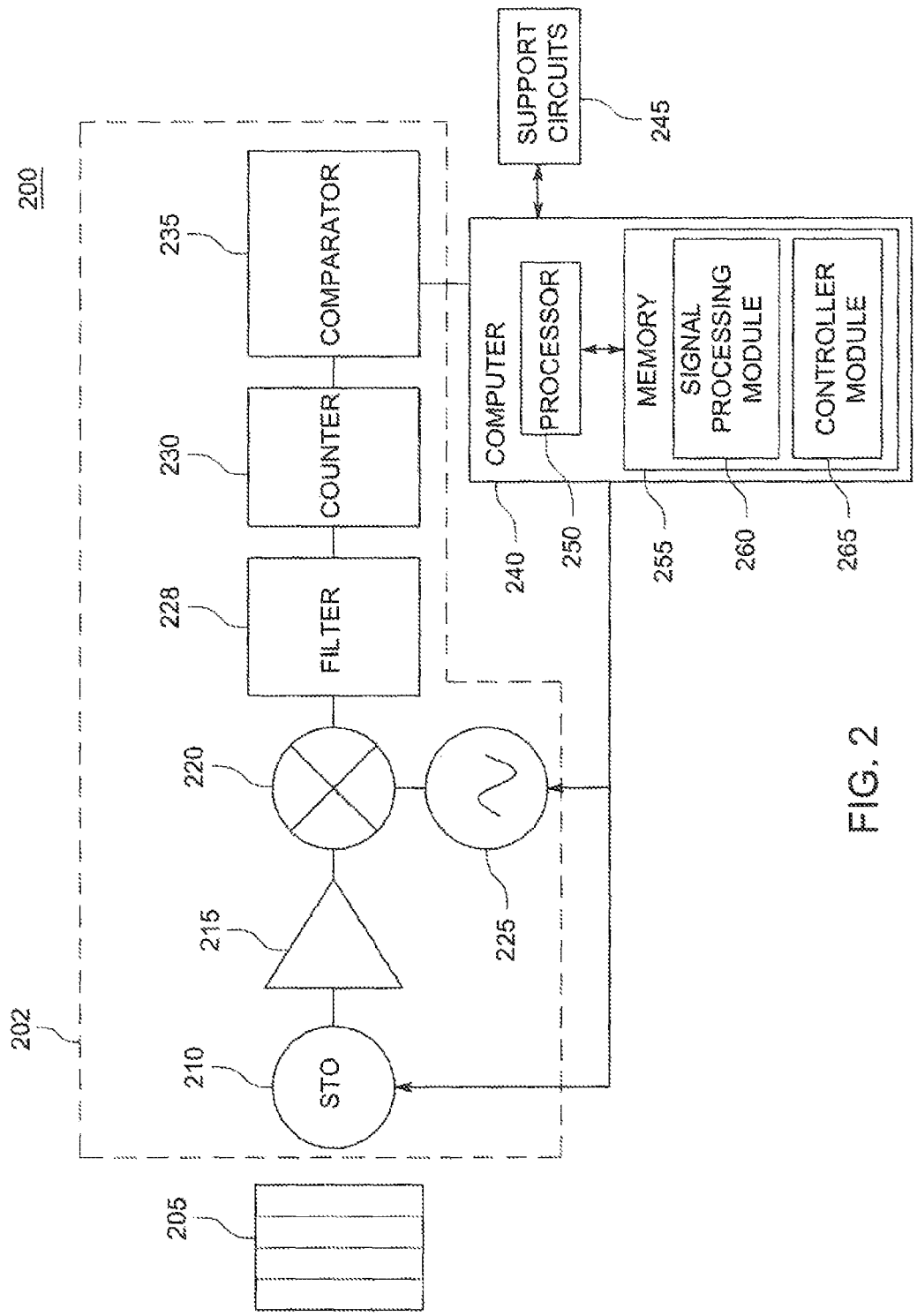
FIG. 2 is a schematic of an exemplary embodiment of the present invention utilizing a superheterodyne receiver and the STO of FIG. 1 to read magnetic media.

FIG. 2 is a schematic of an exemplary embodiment of the present invention utilizing a superheterodyne receiver and the STO of FIG. 1 to read magnetic media. The reader system 200 comprises bit memory regions of magnetic media 205, a STO 210, an amplifier 215, a mixer 220, a filter 228, a local oscillator 225, a counter 230, a comparator 235, and computer 240. A superheterodyne receiver 202 is formed by amplifier 215, mixer 220, filter 228, counter 230, and oscillator 225. The superheterodyne receiver 202 is connected and controlled by a computer 240. Bit regions 205 are positioned very closely (e.g. approximately 40 nm) away from the STO 210. The resulting resonance signal from the alignment is coupled to an amplifier 215 such as a low noise amplifier (LNA). The amplifier couples the signal to a mixer 220. The mixer 220 is a local oscillator 225 and down converts the amplified signal. The mixing is necessary as the STO 210 resonates at such a high frequency, it is not easily measured directly. The mixer produces a difference frequency or an intermediate frequency (IF) in the MHz range, that is filtered by the filter 228 to remove side bands. The resultant signal from the filter 228, is then able to be directly measured efficiently by the frequency counter 230.

The frequency counter 230 digitizes the resulting IF signal for the threshold comparator 235. The comparator 235 applies predetermined known criteria for anticipated frequency shift values for a high or low permeability bit. The results of the high or low bits (i.e. "1" or "0") are then output for processing by the computer 240 comprising a processor 250, memory 255 that may include support circuits 245. The processor 250 in some embodiments may be a microprocessor or microcontroller to execute instructions and store bit values in memory 255. The memory 255 includes a signal processing module 260 for interpreting signals ultimately generated by the STO 210, and a controller module 265 to ensure alignment of the STO 210 and media 205. Support circuits 245 may include A/D converters, D/A converters, alignment sensors or circuitry of the STO 210 and media 205, as well as signal processing for a user interface. Further embodiments may include using the computer 240 to measure the frequency response for a change in quality factor, gain, or impedance matching.

Figure 3:
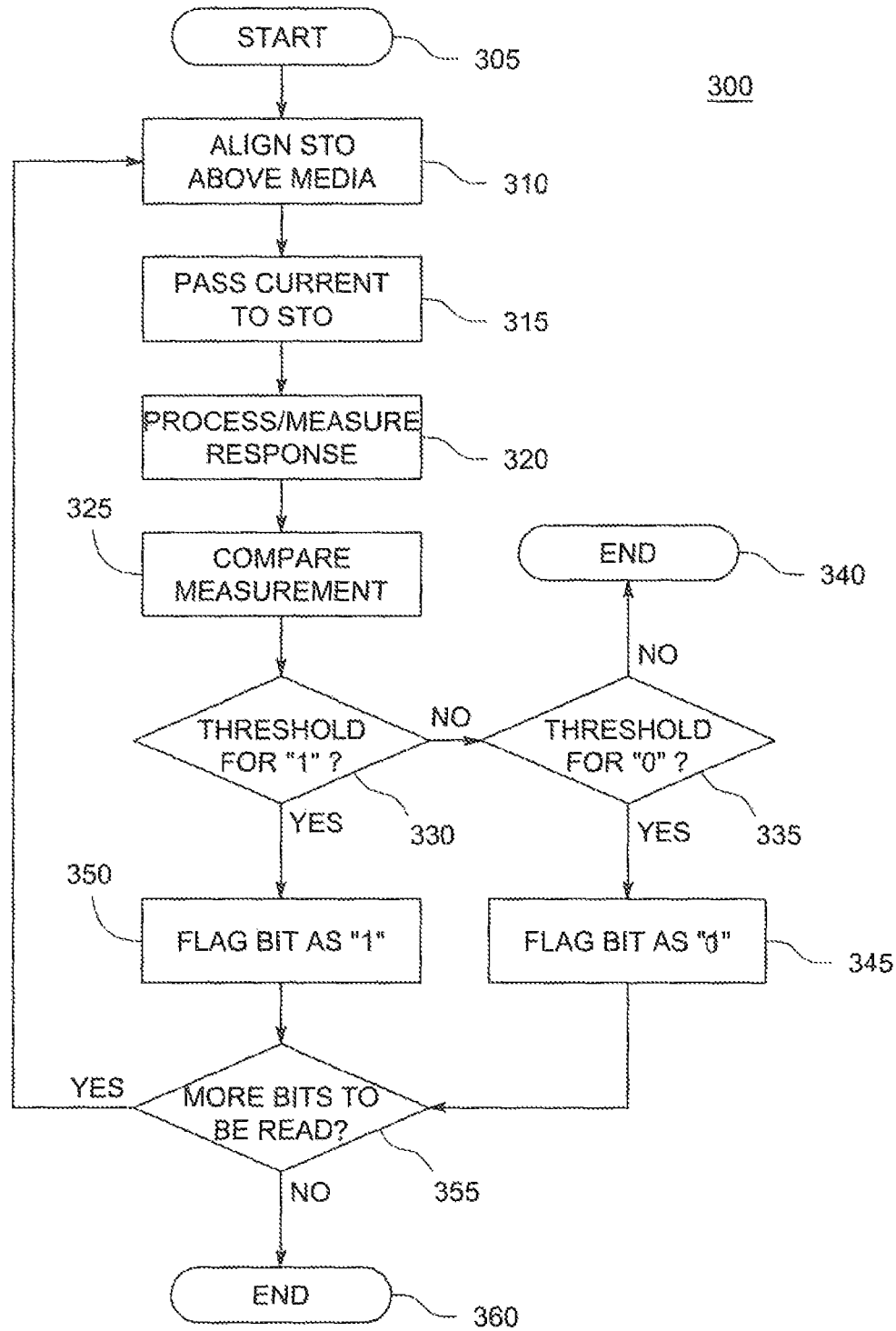
FIG. 3 depicts an exemplary flow diagram to determine bit values of the read media of FIG. 2.

FIG. 3 depicts an exemplary flow diagram to determine bit values of the read media of FIG. 2. The method 300 is implemented by the computer 240 including controller module 265 and signal processing module 260. The method 300 begins at step 305 and aligns a STO above magnetic media at step 310. In some embodiments, the alignment may be achieved through the STO mounted on a mechanical arm suspended over a rotating media disk and an external magnetic field. A current is then passed through the STO at step 315 such that the STO radiates an RE signal. Interactions with the media will change the magnetic field acting on the free layer and alter the frequency observed and processed with RF circuit elements used to make the measurement of the frequency at step 320. The measurement from step 320 is then compared according to predetermined criterion to determine the bit value at step 325.

The criterion includes a threshold for a "1" bit value at step 330, which if returned true, flags the bit location as a "1". The method then determines if there are more bits to be read at step 355, which if true proceeds 365 back to align the STO with the next bit in the media or else the method ends 360. However, if at step 330 it is determined the "1" bit value threshold is not met, the method determines whether the threshold for the bit value is a "0" at step 335. Should the threshold for bit "0" be met, the bit location is accordingly fagged 345 as a "0" and the method continues to determine if more bits are to be read at step 355. However, if step 335 determines the threshold for the "0" bit value is not met the method ends 340 as an error or inconclusive reading. In an exemplary embodiment, wherein the frequency response is measured, the measurement of the bandwidth is compared 325 with predetermined frequency criterion for bit values. As an example, a "1" is where $|\Delta f| > |\Delta f_1/2|$ and "0" is $|\Delta f| \cong 0$, where $\Delta f_1$ is the preset expected value for the high permeability bit.

Figure 4:
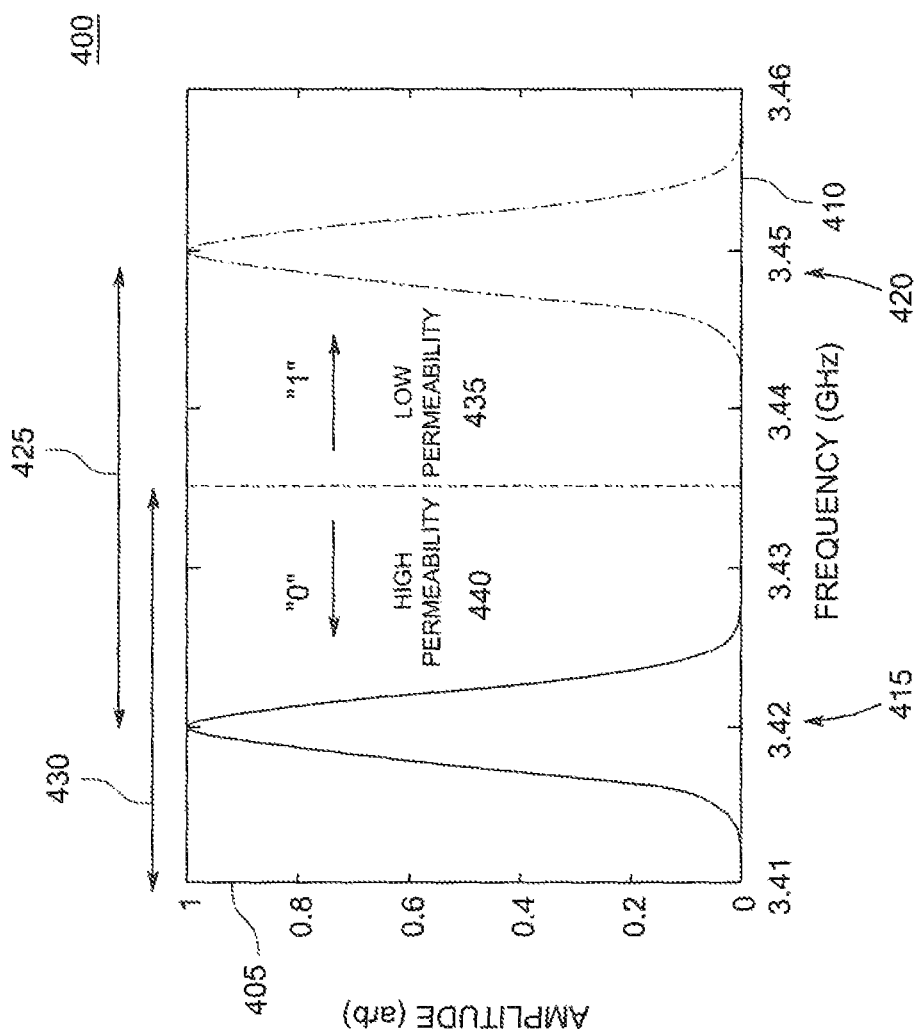
FIG. 4 is a graph of an exemplary comparison threshold applied in FIGS. 2 and 3.

FIG. 4 is a graph 400 of an exemplary comparison threshold applied in FIGS. 2 and 3. In some embodiments, the graph is based on a histogram (not shown) of measuring the frequency of the STO after sampling many bits. The graph 400 plots amplitude 405 versus frequency 410 of the resultant IF signal from the STO. Element 415 depicts the criterion for "0" bit value such that the center frequency is held at approximately 3.42 Hz for a known high permeability bit. Element 420 depicts the criterion for the "1" bit value such that the center frequency is held approximately at 3.45 GHz. Following the criteria above, if it is determined that a frequency change 425 that is more than half the preset expected value for the change, i.e., the difference between the values 420 and 415, of the high permeability bit, i.e., in this case the expected decrease in frequency is 0.03 GHz, the bit is a "1". Also following the criteria above, if the frequency change is near zero, the bit value remains "0". In this embodiment, the high permeability bit state 440 is held to be a "0" and the low permeability bit state 435 is held to be a "1". However, further embodiments may reverse this bit classification such that the high permeability is held as a "1" and low permeability state is a "0" bit state.

Other further embodiments may include rewritable media such as Metglas. Metglas is a material that has a high magnetic permeability of approximately 10,000 $N \cdot A^{-2}$ in the amorphous state and a low permeability of approximately 5-10 $N \cdot A^{-2}$ when it is crystalline. By controlling the cooling rate from above 500° C. after heating, for example through an e-beam or evanescent wave, it is possible to rewrite the media by making the material either crystalline or amorphous. Further embodiments may also include "n"-levels that are signally based on corresponding n-levels of permeability. The multiple levels of permeability may thus also allow for more information to be stored per bit area and/or greater bit density. A given permeability level may represent a symbol comprising multiple bits. Nevertheless, the reader disclosed above utilizes intrinsic magnetic permeability and thus provides the ability to read magnetic media that is effectively immune from corruption by magnetic fields.

While the foregoing is directed to embodiments of the present invention, other and further embodiments of the invention may be devised without departing from the basic scope thereof.

The invention claimed is:

1. A method for reading a magnetic medium comprising the following steps not necessarily in sequential order:
    providing a spin torque oscillator operating to generate a signal at a precision frequency; the spin torque oscillator being connectable to a current source;
    providing a magnetic medium comprising MetGlas® comprising a plurality of bit regions having varying magnetic permeability such that the value of the bit regions is determined by the permeability, low permeability representing one of two binary bit values and high permeability representing the other of the two binary bit values; and the permeability of the plurality of bit regions is processed to assign either a "0" or "1" bit value to the individual bit region by crystallizing the MetGlas® with a laser or allowing the material to remain amorphous and wherein the bit regions form a memory that is nonvolatile;
    providing a magnetic field source proximate the spin torque oscillator and the magnetic medium; the magnetic field source operatively connected to the spin torque oscillator such that variations in the magnetic field generated by the changes in the permeability of the plurality of the bits operate to modify the precession frequency signal of the spin torque oscillator, the magnitude and/or direction of the magnetic field varying in response to the permeability of the plurality of bit regions;
    determining the binary bit values on the magnetic medium based upon the precession frequency of the signal generated by the spin transfer oscillator; the precession frequency of the signal generated by the spin transfer oscillator being measured by a spectrum analyzer coupled to the spin transfer oscillator, the spectrum analyzer measuring frequency shifts.

2. An apparatus for reading a magnetic medium comprising:
    a current source;
    a spin torque oscillator, operatively connected to the current source, for generating a signal at the precision frequency; the spin torque oscillator adapted to be positioned above a magnetic medium, the magnetic medium comprising a plurality of bit regions having varying magnetic permeability such that the value of the bit regions is determined by the state of permeability, low permeability representing one of two binary bit values and high permeability representing the other of the two binary bit values;
    a magnetic field source operatively connected to the spin torque oscillator that generates a magnetic field; the precession frequency of the spin torque oscillator being modified by variations in the magnetic field, the magnitude and/or direction of the magnetic field varying in response to the magnetic permeability of the plurality of bit regions;
    a local oscillator whose frequency is that of the spin transfer oscillator when it is not modified by the magnetic permeability of the medium, a circuit that mixes the signals of the spin transfer oscillator and the local oscillator to produce an intermediate frequency, a frequency counter operatively connected to the mixer that digitizes the intermediate frequency and a comparator operatively connected to the frequency counter that applies predetermined value criteria for anticipated frequency shift values for a high or low permeability bit value;
    whereby the precession frequency of the signal generated by the spin transfer oscillator varies in response to variations in the magnetic field affected by the magnetic permeability of the plurality of bit regions providing a reading of the bit values on the magnetic medium by the spin torque oscillator.

3. An apparatus for reading a magnetic medium comprising:
    a current source;
    a spin torque oscillator, operatively connected to the current source, for generating a signal at the precision frequency; the spin torque oscillator adapted to be positioned above a magnetic medium, the magnetic medium-comprising Metglas® having an amorphous and crystalline states corresponding to a plurality of bit regions of high and low permeability, respectively; such that the value of the bit regions is determined by the state of permeability, low permeability representing one of two binary bit values and high permeability representing the other of the two binary bit values;
    a magnetic field source operatively connected to the spin torque oscillator that generates a magnetic field; the precession frequency of the spin torque oscillator being modified by variations in the magnetic field, the magnitude and/or direction of the magnetic field varying in response to the magnetic permeability of the plurality of bit regions;
    whereby the precession frequency of the signal generated by the spin transfer oscillator varies in response to variations in the magnetic field affected by the magnetic permeability of the plurality of bit regions providing a reading of the bit values on the magnetic medium by the spin torque oscillator.

4. The apparatus of claim 3 wherein the low permeability regions are created in the Metgals® by crystallization using a laser.

5. The apparatus of claim 3 wherein the magnetic field source is one of a permanent magnet or an electromagnet.

* * * * *